US010072331B2

United States Patent
Takeuchi et al.

(10) Patent No.: US 10,072,331 B2
(45) Date of Patent: Sep. 11, 2018

(54) METHOD FOR FORMING SILICON FILM AND METHOD FOR MANUFACTURING POWER STORAGE DEVICE

(75) Inventors: Toshihiko Takeuchi, Kanagawa (JP); Kazutaka Kuriki, Kanagawa (JP); Makoto Ishikawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1235 days.

(21) Appl. No.: 13/537,294

(22) Filed: Jun. 29, 2012

(65) Prior Publication Data

US 2013/0011550 A1 Jan. 10, 2013

(30) Foreign Application Priority Data

Jul. 8, 2011 (JP) .................................. 2011-151597

(51) Int. Cl.
*C23C 16/24* (2006.01)
*C23C 16/02* (2006.01)
(Continued)

(52) U.S. Cl.
CPC .......... *C23C 16/24* (2013.01); *C23C 16/0281* (2013.01); *C23C 16/56* (2013.01);
(Continued)

(58) Field of Classification Search
CPC ..... C23C 16/24; C23C 16/0281; C23C 16/56; C23C 16/26; C23C 16/00; C23C 16/01
(Continued)

(56) References Cited

U.S. PATENT DOCUMENTS 5,254,369 A * 10/1993 Arai et al. ................. 427/248.1
7,463,476 B2 12/2008 Lee et al.
(Continued)

FOREIGN PATENT DOCUMENTS

JP 56-152737 A 11/1981
JP 2001-210315 8/2001
(Continued)

OTHER PUBLICATIONS

Voutsas, A.T., Hatalis, M.K., Deposition and Crystallization of a-Si Low Pressure Chemically Vapor Deposited Film Obtained by Low-Temperature Pyrolysis of Disilane, J. Electrochem. Soc., 1993, vol. 140, No. 3, p. 871-877.*
Cui, L., Ruffo, R., Chan, C., Peng, H., Cui, Y., Crystalline-Amorphous Core-Shell Silicon Nanowires for High Capacity and High Current Battery Electrodes, Nano Letters, 2009, vol. 9, No. 1, p. 491-495.*
Liu, Z.Q., Zhou, W.Y., Sun, L.F., Tang, D.S., Zou, X.P., Li, Y.B., Wang, C.Y., Wang, G., Xie, S.S., "Growth of Amorphous Silicon Nanowires", 2001, Chemical Physics Letters, p. 523-528.*
Kamins, T.I., Williams, R.S>, Chen, Y., Chang, Y.L. Chang, Y.A., "Chemical Vapor Deposition of Si Nanowires Nucleated by TiSi2 Islands on Si", 2000, Applied Physics Letters, p. 562-564.*
(Continued)

*Primary Examiner* — Katherine A Bareford
*Assistant Examiner* — Christina D McClure
(74) *Attorney, Agent, or Firm* — Nixon Peabody LLP; Jeffrey L. Costellia (57) ABSTRACT

A formation method of a silicon film which contributes to improvements in cycle characteristics and an increase in charge/discharge capacity and can be used as an active material layer is provided. In addition, a manufacturing method of a power storage device including the silicon film is provided. The formation method is as follows. A crystalline silicon film is formed over a conductive layer by an LPCVD method. The supply of a source gas is stopped and heat treatment is performed on the silicon film while the source gas is exhausted. The silicon film is grown to have whisker-like portions by an LPCVD method while the source gas is supplied into the reaction space. A power storage device is manufactured using, as an active material layer included in a negative electrode, the silicon film grown to have whisker-like portions.

20 Claims, 5 Drawing Sheets (51) Int. Cl.
*C23C 16/56* (2006.01)
*H01M 4/134* (2010.01)
*H01M 4/38* (2006.01)
*H01G 11/30* (2013.01)
*H01G 11/50* (2013.01)
*H01M 10/0525* (2010.01)

(52) U.S. Cl.
CPC ............ *H01G 11/30* (2013.01); *H01G 11/50* (2013.01); *H01M 4/134* (2013.01); *H01M 4/386* (2013.01); *H01M 10/0525* (2013.01); *Y02E 60/13* (2013.01)

(58) Field of Classification Search
CPC ..... C23C 16/045; C23C 16/047; C23C 16/52; C23C 16/02; C23C 16/0209; C23C 16/04; C23C 16/06; C23C 16/345; C23C 16/402; C23C 16/42; C23C 16/45557; C23C 16/4557; C23C 16/46; C23C 16/481; C23C 16/511; C23C 16/545; C23C 16/0272; C23C 16/271; C23C 16/455; C23C 16/45563; C23C 16/45576; C23C 16/30; C23C 16/303; C23C 16/308; C23C 16/325; C23C 16/403; C23C 16/405; C23C 16/44; C23C 16/4417; C23C 16/442; C23C 16/0245; C23C 14/086; C23C 14/28; C23C 14/0005; C23C 14/22; C23C 14/223; C23C 14/228; C23C 14/00; C23C 14/025; C23C 14/14; C23C 14/225; C23C 14/325; C23C 14/54; C23C 14/04; C23C 14/0635; C23C 14/541; C23C 14/34; C23C 14/08; C23C 14/3414; C23C 18/08; C23C 18/1204; C23C 18/1216; C23C 18/122; C23C 18/14; C23C 18/048; C23C 26/00; C23C 4/121; C23C 16/14; C23C 16/16; C23C 16/274; C23C 16/32; C23C 16/4401; C23C 16/4409; C23C 16/4412; C23C 16/448; C23C 16/452; C23C 16/45517; C23C 16/45565; C23C 16/45578; C23C 16/4558; C23C 16/4585; C23C 16/4586; C23C 16/48; C23C 16/488; C23C 16/503; C23C 28/048; C23C 28/042; C23C 28/42; C23C 28/00; C01B 33/02; C01B 33/06; H01M 4/134; H01M 4/386; H01M 4/366; H01M 4/0452; H01M 4/1395; H01M 4/661; H01M 4/70; H01M 4/13; H01M 4/133; H01M 4/139; H01M 4/1393; H01M 4/583; H01M 4/587; H01M 4/62; H01M 4/667; H01M 4/04; H01M 4/0416; H01M 4/0471; H01M 4/625; H01M 4/64; H01M 4/38; H01M 4/48; H01M 4/0402; H01M 4/137; H01M 4/1399; H01M 4/58; H01M 4/602; H01M 4/621; H01M 4/626; H01M 4/662; H01M 4/665; H01M 4/78; H01M 4/0428; H01M 4/66; H01M 4/60; H01M 4/663; H01M 4/0492; H01M 4/381; H01M 10/052; H01M 10/0525; H01M 10/0436; H01M 10/056; H01M 10/0562; H01M 10/0565; H01M 10/0566; H01M 10/058; H01M 10/0587; H01M 10/04; H01M 10/446; H01M 2300/0082; H01M 2300/0094; H01M 2300/0068; H01M 2300/0077; H01M 2300/0025; H01M 12/08; H01M 2002/0205; H01M 2004/027; H01M 2010/0495; H01M 2/145; H01M 2/16; H01M 4/608; H01M 4/624; H01M 4/628; H01M 4/664; H01M 4/762; H01M 4/96; H01G 11/30; H01G 11/50; Y02E 60/13
USPC .......................................................... 427/58
See application file for complete search history.

(56) References Cited

U.S. PATENT DOCUMENTS

| 7,688,570 | B2 | 3/2010 | Lee et al. | |
|---|---|---|---|---|
| 8,257,866 | B2 | 9/2012 | Loveness et al. | |
| 8,450,012 | B2 | 5/2013 | Cui et al. | |
| 8,556,996 | B2 | 10/2013 | Loveness et al. | |
| 8,846,530 | B2 | 9/2014 | Furuno et al. | |
| 9,172,088 | B2 | 10/2015 | Loveness et al. | |
| 9,172,094 | B2 | 10/2015 | Loveness et al. | |
| 9,231,243 | B2 | 1/2016 | Cui et al. | |
| 2010/0193768 | A1* | 8/2010 | Habib | 257/9 |
| 2010/0285358 | A1 | 11/2010 | Cui et al. | |
| 2010/0330419 | A1 | 12/2010 | Cui et al. | |
| 2010/0330421 | A1 | 12/2010 | Cui et al. | |
| 2011/0229761 | A1 | 9/2011 | Cui et al. | |
| 2011/0266654 | A1 | 11/2011 | Kuriki et al. | |
| 2011/0312121 | A1* | 12/2011 | Yamazaki | 438/71 |
| 2012/0003383 | A1 | 1/2012 | Furuno | |
| 2012/0003807 | A1 | 1/2012 | Furuno et al. | |
| 2012/0070741 | A1 | 3/2012 | Liu et al. | |
| 2012/0183856 | A1 | 7/2012 | Cui et al. | |
| 2012/0328962 | A1 | 12/2012 | Takeuchi et al. | |
| 2016/0013483 | A1 | 1/2016 | Loveness et al. | |

FOREIGN PATENT DOCUMENTS

| JP | 2006-287197 A | 10/2006 |
|---|---|---|
| JP | 2010-262752 A | 11/2010 |
| JP | 2012-031513 A | 2/2012 |
| JP | 2013-030464 A | 2/2013 |
| JP | 2015-165506 A | 9/2015 |
| KR | 2006-0104856 A | 10/2006 |
| WO | WO-2010/129910 | 11/2010 |
| WO | WO-2010/138617 | 12/2010 |
| WO | WO-2010/138619 | 12/2010 |
| WO | WO-2011/109477 | 9/2011 |
| WO | WO-2011/119614 | 9/2011 |
| WO | WO-2011/149958 | 12/2011 |
| WO | WO-2012/054767 | 4/2012 |

OTHER PUBLICATIONS

Finucane, E.W., "Definitions, Conversions, and Calculations for Occupational Safety and Health Professionals", 2006, Taylor and Francis, Chapter 1, p. 1-1 to 1-61.*
Brown, E.W., "An Introduction to Solar Energy", 1988, p. 1-5.*
Archer, M. D., Nozik, A. J., "Nanostructured and Photoelectrochemical Systems for Solar Photon Conversion", 2008, World Scientific, section 2.5, section authors Miller and Memming, p. 120-130.*
Chan et al., "High-Performance Lithium Battery Anodes Using Silicon Nanowires", Nature Nanotechnology, vol. 3, pp. 31-35, Dec. 16, 2007.
Korean Office Action (Application No. 2012-0068760) dated Jun. 26, 2018.

* cited by examiner

METHOD FOR FORMING SILICON FILM AND METHOD FOR MANUFACTURING POWER STORAGE DEVICE

BACKGROUND OF THE INVENTION

1. Field of the Invention

The present invention relates to a method for forming a silicon film and a method for manufacturing a power storage device including the silicon film.

Note that the power storage device indicates every element and every device which have a function of storing power.

2. Description of the Related Art

In recent years, power storage devices such as lithium-ion secondary batteries, lithium-ion capacitors, and air cells have been developed.

An electrode for such a power storage device is manufactured by forming an active material over a surface of a current collector. As the active material, a material which can store and release ions serving as carriers, such as carbon or silicon, is used. In addition, phosphorus-doped silicon has larger theoretical capacity than carbon and thus is advantageous in terms of increasing capacity of a power storage device (see Patent Document 1).

REFERENCE

[Patent Document 1] Japanese Published Patent Application No. 2001-210315

SUMMARY OF THE INVENTION

However, when silicon is used as an active material layer of a power storage device, the silicon expands and contracts repeatedly due to repeated charge and discharge cycles. As a result, the silicon turns into fine powder and separation or the like is caused, which deteriorates properties of the power storage device.

Therefore, even when silicon is used as an active material layer, it is difficult to obtain charge/discharge capacity as high as the theoretical capacity.

In view of the above problems, an object is to provide a method for forming a silicon film which contributes to improvements in cycle characteristics and an increase in charge/discharge capacity and can be used as an active material layer. Another object is to provide a method for manufacturing a power storage device including the silicon film.

One embodiment of the present invention is a method for forming a silicon film. The method includes the following steps: forming a crystalline silicon film over a conductive layer by a low-pressure chemical vapor deposition method (hereinafter also referred to as an LPCVD method) using a deposition gas containing silicon as a source gas; stopping the supply of the source gas and performing heat treatment on the silicon film while exhausting the source gas; and growing the silicon film so that it has whisker-like portions by an LPCVD method while supplying the source gas whose flow rate is different from that of the source gas used in forming the silicon film into the reaction space. One embodiment of the present invention is a method for manufacturing a power storage device including the silicon film as an active material layer.

One embodiment of the present invention is a method for forming a silicon film. The method includes the following steps: forming a crystalline silicon film over a conductive layer and a mixed layer over part or the whole face of the outer layer of the conductive layer by an LPCVD method using a deposition gas containing silicon as a source gas; stopping the supply of the source gas and performing heat treatment on the silicon film while exhausting the source gas; and growing the silicon film so that it has whisker-like portions by an LPCVD method while supplying the source gas whose flow rate is different from that of the source gas used in forming the silicon film and the mixed layer into the reaction space. One embodiment of the present invention is a method for manufacturing a power storage device including the silicon film as an active material layer.

In the above, an LPCVD method is performed with a source gas supplied into a reaction space. The source gas contains a deposition gas containing silicon. Further, an LPCVD method is performed at a temperature higher than 530° C.

In the above, the heat treatment may be performed at a temperature higher than 530° C. In addition, silicon hydride, silicon fluoride, or silicon chloride may be used for the deposition gas containing silicon.

In the above, the conductive layer can be formed using a metal element which forms silicide by reacting with silicon. The metal element may be zirconium, titanium, hafnium, vanadium, niobium, tantalum, chromium, molybdenum, tungsten, cobalt, or nickel.

According to one embodiment of the present invention, it is possible to form a silicon film which is less likely to turn into fine powder to be separated due to repeated charge and discharge cycles and can be used as an active material layer. Further, a power storage device having improved cycle characteristics and increased charge/discharge capacity can be manufactured.

DETAILED DESCRIPTION OF THE INVENTION

Embodiments and an example of the present invention will be described below with reference to the drawings. Note that the present invention is not limited to the following description, and it will be easily understood by those skilled in the art that various changes and modifications can be made without departing from the spirit and scope of the present invention. Thus, the present invention should not be interpreted as being limited to the following description of the embodiments and example. In description using the drawings for reference, in some cases, common reference numerals are used for the same portions in different drawings. Further, in some cases, the same hatching patterns are applied to similar portions, and the similar portions are not necessarily designated by reference numerals.

(Embodiment 1)

In this embodiment, a method for forming a silicon film according to one embodiment of the present invention and an example of applying the silicon film to an active material layer of a power storage device will be described with reference to drawings.

Figure 1A:
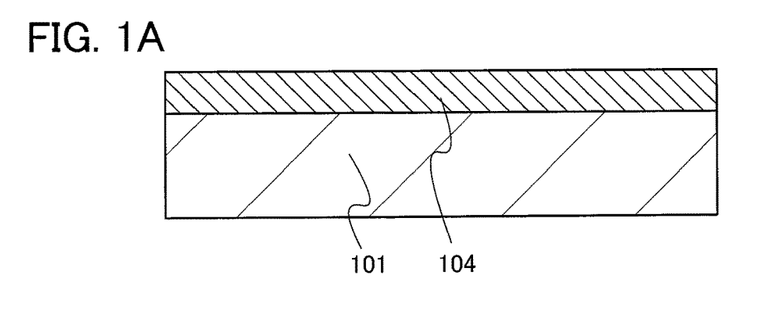
FIGS. 1A to 1C are cross-sectional views which illustrate a method for forming a silicon film.

A conductive layer 104 is formed over a substrate 101 (see FIG. 1A). The conductive layer 104 can be formed using a conductive material and a method such as a printing method, a sol-gel method, a coating method, an ink-jet method, a CVD method, a sputtering method, or an evaporation method as appropriate. In addition, the conductive layer 104 may have a foil shape, a plate shape, a net shape, or the like. Note that in the case where the conductive layer 104 has a foil shape or a plate shape, it is not necessary to provide the substrate 101. In the case where the conductive layer 104 has a foil shape, roll-to-roll processing can be employed.

The conductive layer 104 is preferably formed using a metal element which forms a mixed layer on part or the whole face of the outer layer of the conductive layer 104 by reaction with silicon. The mixed layer contains silicide formed when the metal element reacts with silicon.

Alternatively, the conductive layer 104 can have any of the following structures: a structure including a layer formed over the substrate 101 with the use of a metal element having high conductivity such as platinum, aluminum, copper, or titanium; a structure including a layer formed over the substrate 101 with the use of a metal element having high conductivity such as an aluminum alloy to which an element which increases heat resistance, such as silicon, titanium, neodymium, scandium, or molybdenum, is added; and a layered structure including a layer formed over the above layer with the use of a metal element which forms silicide.

Examples of the metal element which forms silicide include zirconium, titanium, hafnium, vanadium, niobium, tantalum, chromium, molybdenum, cobalt, and nickel.

Figure 2A:
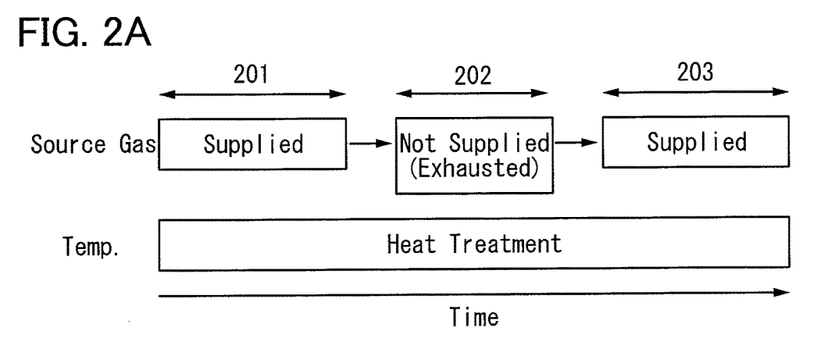
FIGS. 2A and 2B illustrate a method for forming a silicon film.

A method for forming a silicon film according to one embodiment of the present invention will be specifically described following the sequence of formation in FIG. 2A. The formation method includes a first step 201 of forming a crystalline silicon film over a conductive layer by an LPCVD method using a source gas which contains a deposition gas containing silicon; a second step 202 of performing heat treatment on the silicon film while exhausting the source gas; a third step 203 of growing the silicon film so that it has whisker-like portions by an LPCVD method using a source gas whose flowing rate is different from that of the source gas used in the first step 201 (in particular, the flow rate of the deposition gas containing silicon).

In the first step 201, a first silicon film 109 including a region 109a formed of crystalline silicon and seed crystals 109b formed of crystalline silicon is formed over the conductive layer 104 by an LPCVD method. The seed crystals 109b grow from the region 109a to be dispersively formed at random (see FIG. 1B). Note that the first silicon film 109 may contain amorphous silicon.

In an LPCVD method in the first step 201, a source gas which contains a deposition gas containing silicon is supplied into a reaction space in an LPCVD apparatus and the temperature is set to higher than or equal to 530° C. and lower than or equal to a temperature which the substrate 101, the conductive layer 104, and the LPCVD apparatus can withstand, preferably higher than or equal to 530° C. and lower than 650° C. That is to say, in the first step 201, the substrate 101 over which the conductive layer 104 is formed is heated while the source gas is supplied (see FIG. 2B).

The pressure in the first step 201 is set to 10 Pa to 1000 Pa inclusive, preferably 20 Pa to 200 Pa inclusive. Note that the pressure falls within the range of pressures at which crystalline silicon can be formed.

In the first silicon film 109, the interface between the region 109a and the seed crystals 109b is vague and thus, the following surface is defined as the interface between the region 109a and the seed crystals 109b: a surface which is parallel to a surface of the conductive layer 104 and overlaps with the bottom of the deepest valley of valleys each formed between the adjacent seed crystals of the seed crystals 109b.

Examples of the deposition gas containing silicon, which is the source gas, include silicon hydride, silicon fluoride, and silicon chloride; typically, $SiH_4$, $Si_2H_6$, $SiF_4$, $SiCl_4$, $Si_2Cl_6$, and the like are given. Note that one or more of rare gases such as helium, neon, argon, and xenon, a hydrogen gas, and a nitrogen gas may be mixed into the source gas.

In the first step 201, the flow rate of the deposition gas containing silicon may be appropriately determined in consideration of the thickness and the deposition rate of the first silicon film 109, and the like. For example, the flow rate of the deposition gas containing silicon may be greater than or equal to 300 sccm and less than or equal to 1000 sccm, and the thickness of the first silicon film 109 may be greater than or equal to 30 nm and less than or equal to 500 nm. The thickness refers to the distance between the bottom surface of the region 109a and the top (or the top surface) of the highest seed crystal of the seed crystals 109b in the first silicon film 109.

When the source gas contains phosphine or diborane, the region 109a and the seed crystals 109b can contain an impurity element imparting one conductivity type (e.g., phosphorus or boron). When the region 109a and the seed crystals 109b contain an impurity element imparting one conductivity type, the conductivity of the silicon film to be formed can be increased, which allows an increase in charge/discharge capacity of a power storage device.

Figure 1B:
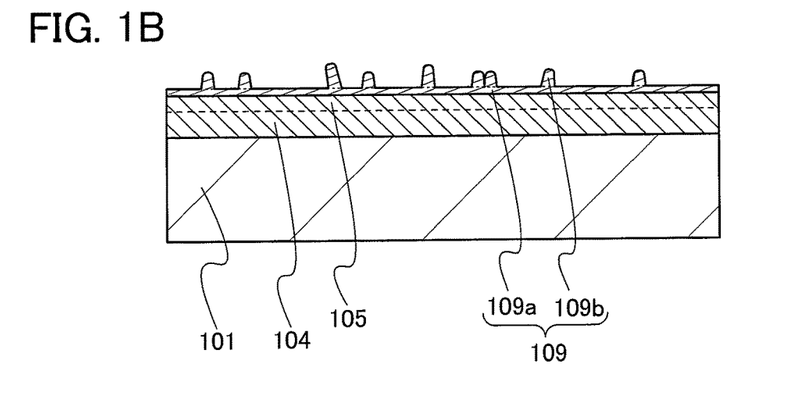

When the first silicon film 109 is formed, depending on heating conditions, a mixed layer 105 is formed between the conductive layer 104 and the first silicon film 109 (in particular, the region 109a) (see FIG. 1B).

The mixed layer 105 is formed in such a manner that active species in the source gas (e.g., radicals which are derived from the deposition gas, or hydrogen radicals) are supplied to a deposition region (deposition portion) and silicon is diffused into the conductive layer 104 from the first silicon film 109. In the case where the mixed layer 105 is formed on part of the outer layer of the conductive layer 104, the mixed layer 105 and the conductive layer 104 are provided below the first silicon film 109 (in particular, the region 109a) (not illustrated). In the case where the mixed layer 105 is formed on the whole face of the outer layer of the conductive layer 104, the mixed layer 105 is provided below the first silicon film 109 (in particular, the region 109a) (see FIG. 1B). Note that the mixed layer 105 also functions as a conductive layer because the mixed layer 105 has conductivity.

In the case where the flow rate of the deposition gas containing silicon is low in the first step 201, a low density region is formed between the conductive layer 104 and the region 109a in some cases. The low density region can be said to contain one or more of a metal element contained in the conductive layer 104, silicide contained in the mixed layer 105 (a specific example will be described later), and crystalline silicon contained in the region 109a. When the low density region is formed and the silicon film including the low density region is used as an active material layer of a power storage device, the silicon film turns into fine powder as the volume of the silicon film is changed due to storage and release of ions serving as carriers, and thus, separation is caused from the low density region. As a result, properties of the power storage device are deteriorated. Further, the low density region inhibits the flow of electrons at the time of charge/discharge; therefore, favorable charge/discharge characteristics cannot be obtained. For that reason, the amount of the deposition gas containing silicon, which is supplied in the first step 201, is preferably large. The large amount of the deposition gas containing silicon can suppress formation of the low density region, so that a power storage device having favorable properties can be manufactured.

The mixed layer 105 is silicide formed by reaction between silicon and any of the metal elements listed above. As the silicide, at least one of zirconium silicide, titanium silicide, hafnium silicide, vanadium silicide, niobium silicide, tantalum silicide, chromium silicide, molybdenum silicide, cobalt silicide, and nickel silicide is formed. Note that the mixed layer 105 may contain a metal element which does not form the silicide.

Note that, in some cases, a metal oxide layer (not illustrated) formed of an oxide of a metal element contained in the conductive layer 104 is formed on the conductive layer 104. This is because oxygen is released from a sidewall of a quartz reaction chamber of the LPCVD apparatus due to the heating in forming the first silicon film 109 by an LPCVD method and the conductive layer 104 is oxidized. Note that when the first silicon film 109 is formed by an LPCVD method, the reaction chamber (also referred to as a reaction space) may be filled with a rare gas such as helium, neon, argon, and/or xenon. In the case where the reaction chamber is filled with such a rare gas, formation of a metal oxide layer can be suppressed. Also in the case where the mixed layer 105 is formed, a metal oxide layer formed of an oxide of a metal element contained in the mixed layer 105 is formed on the mixed layer 105 in some cases for the above reason. Note that the metal oxide layer may be formed on the surface of the conductive layer 104 before formation of the mixed layer 105.

Examples of the above metal oxide layer include zirconium oxide, titanium oxide, hafnium oxide, vanadium oxide, niobium oxide, tantalum oxide, chromium oxide, molybdenum oxide, tungsten oxide, cobalt oxide, and nickel oxide. When the conductive layer 104 is formed using titanium, zirconium, niobium, tungsten, or the like, the metal oxide layer contains an oxide semiconductor such as titanium oxide, zirconium oxide, niobium oxide, or tungsten oxide; therefore, it is possible to reduce one of or both resistance between the conductive layer 104 and the mixed layer 105 and resistance between the mixed layer 105 and the first silicon film 109.

Note that the first silicon film 109 may contain the metal element contained in the conductive layer 104 or silicide formed with the metal element.

The seed crystals 109b are more easily formed as a surface of a lower layer in contact with the region 109a (the conductive layer 104 or the mixed layer 105) is more uneven. Thus, a surface of the mixed layer 105 is preferably uneven; the uneven surface of the mixed layer 105 allows an increase in formation density of the seed crystals 109b per unit area. The increase in formation density results in an increase in formation density of whisker-like portions of the silicon film to be formed in the third step 203 per unit area.

Note that the conductive layer 104 may have an uneven shape in advance. In such a case, an uneven shape is more easily formed on the surface of the mixed layer 105, leading to an increase in formation density of the seed crystals 109b per unit area. The increase in formation density results in an increase in formation density of the whisker-like portions of the silicon film to be formed in the third step 203 per unit area. In order that the conductive layer 104 can have an uneven shape, the conductive layer 104 may be subjected to a photolithography process and an etching step. Further, when the conductive layer 104 is formed thin (to a thickness of approximately 2 nm to 100 nm for example), the conductive layer 104 can have an uneven shape reflecting roughness (unevenness) of a surface (of the substrate 101 here) over which the conductive layer 104 is formed.

Figure 2B:
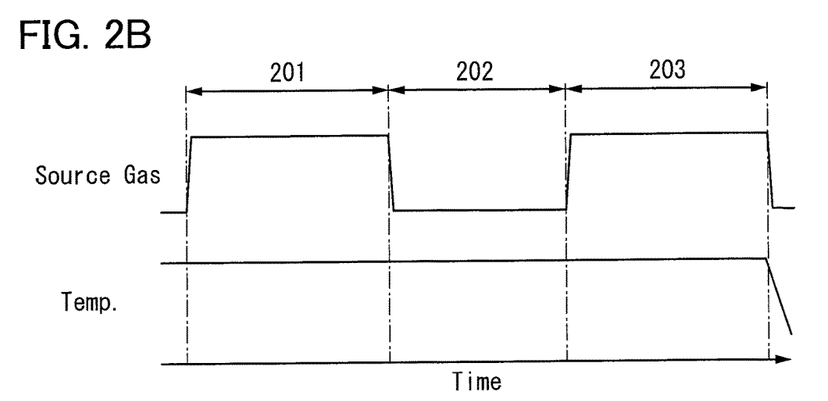

Next, the second step 202 is performed. In the second step 202, the supply of the source gas is stopped, and heat treatment is performed on the first silicon film 109 while the source gas is exhausted from the reaction space in the LPCVD apparatus. As illustrated in FIG. 2B, heating is performed continuously through the first step 201 and the second step 202. To be exact, the heat treatment includes a step_A in which heating is performed in the state where the source gas is in the reaction space and a step_B in which heating is performed in the state where the source gas is exhausted from the reaction space (also referred to as the state where almost no source gas is in the reaction space). The second step 202 can also be referred to as heat treatment in vacuum.

Note that the heating temperature in the first step 201 and the heating temperature in the second step 202 may be substantially the same or different from each other. In addition, the heating temperature in the second step 202 may be kept constant or may be changed step by step or successively.

The mixed layer 105 is formed by performing heating in the state where the source gas (in particular, the active species) is in the reaction space. In the case where a low density region is formed between the conductive layer 104 and the region 109a in the first step 201, as a result of continuous heating in the state where the source gas is in the reaction space, the low density region expands as a region of the mixed layer 105 expands. When the silicon film including the expanded low density region is used as an active material layer of a power storage device, it is not possible to expect improvements in properties of the power storage device. Even in the case where a low density region is not formed between the conductive layer 104 and the region 109a in the first step 201, as a result of continuous heating in the state where the source gas is in the reaction space, a low density region might be formed with expansion of a region of the mixed layer 105.

In view of the above problems, in the second step 202, the supply of the source gas is stopped, and heat treatment is performed while the source gas is exhausted, so that formation or expansion of the low density region can be suppressed. Note that in the second step 202, the step_A is not performed so long that the mixed layer 105 is expanded; thus, it can be said that the low density region is not formed or expanded in the step_A. Further, through the step_B, which is the major part of the second step 202, formation or expansion of the low density region can be suppressed also in the third step 203.

Note that time in which the second step 202 is performed is not particularly limited but is preferably less than or equal to 10 minutes in consideration of productivity.

The silicide contained in the mixed layer 105 at the time after the second step 202 may have a composition different from that of the silicide contained in the mixed layer 105 at the time after the first step 201.

The silicon film at the time after the second step 202 may contain the metal element contained in the conductive layer 104 or the silicide, which is formed with the metal element and contained in the mixed layer 105.

Next, the third step 203 is performed. In the third step 203, the silicon film subjected to the second step 202 using an LPCVD method is grown to have whisker-like portions, so that a second silicon film 110 is formed.

In an LPCVD method in the third step 203, the supply of the source gas stopped being supplied into the reaction space in the LPCVD apparatus is resumed and the temperature is set to higher than or equal to 530° C. and lower than or equal to a temperature which the substrate 101, the conductive layer 104, and the LPCVD apparatus can withstand, preferably higher than or equal to 530° C. and lower than 650° C. That is to say, in the third step 203, the substrate 101 over which the conductive layer 104 and the first silicon film 109 are formed is heated while the source gas is supplied (see FIG. 2B). As illustrated in FIG. 2B, heating is performed continuously through the second step 202 and the third step 203.

The source gas in the third step 203 is the same as that in the first step 201.

In the third step 203, the flow rate of the deposition gas containing silicon, which is the source gas, may be higher than that in the first step 201. For example, the ratio of the flow rate in the third step 203 to that in the first step 201 (the third step 203/the first step 201) may be higher than 1.0 and lower than or equal to 2.0, preferably higher than or equal to 1.2 and lower than or equal to 2.0. When the flow rate of the deposition gas containing silicon in the third step 203 is higher than that in the first step 201, the deposition rate of silicon can be increased, and thus, time for growing the silicon film subjected to the second step 202 so that it has whisker-like portions can be reduced. Accordingly, the silicon film according to one embodiment of the present invention and the power storage device according to one embodiment of the present invention can be manufactured with high productivity. Note that the flow rate of the deposition gas containing silicon in the third step 203 may be lower than that in the first step 201. For example, the ratio of the flow rate in the third step 203 to that in the first step 201 (the third step 203/the first step 201) may be higher than or equal to 0.3 and lower than 1.0, preferably equal to or higher than 0.3 and lower than or equal to 0.8.

The pressure in the third step 203 is set to 10 Pa to 1000 Pa inclusive, preferably 20 Pa to 200 Pa inclusive.

When the source gas contains phosphine or diborane also in the third step 203, the second silicon film 110 can contain an impurity element imparting one conductivity type (e.g., phosphorus or boron). When the second silicon film 110 contains an impurity element imparting one conductivity type, the conductivity of the second silicon film 110 can be increased, which allows an increase in charge/discharge capacity of a power storage device.

Figure 1C:
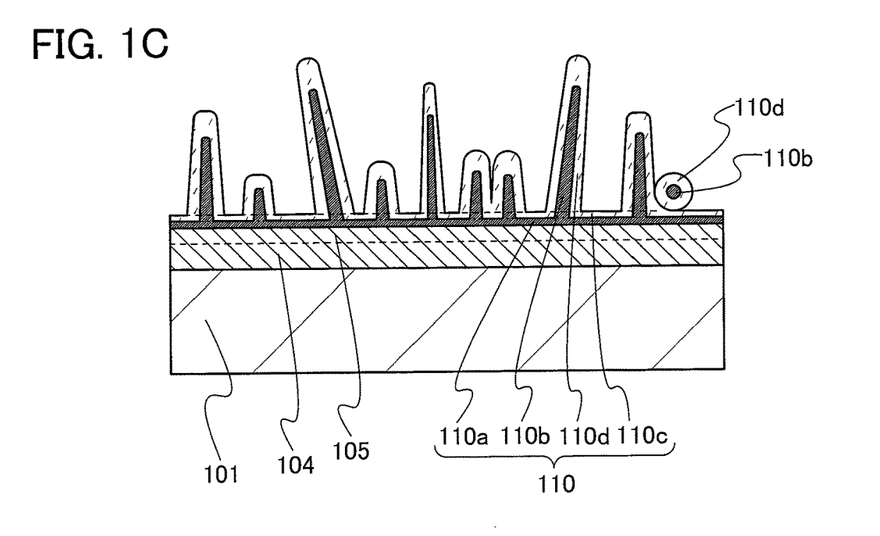

The second silicon film 110 includes a region 110a and a core 110b which are formed of crystalline silicon and a region 110c and an outer shell 110d which are partly or wholly formed of amorphous silicon (see FIG. 1C). Note that the region 110c and the outer shell 110d may contain crystalline silicon. The second silicon film 110 is also called a whisker group because it has a plurality of whisker-like portions.

The second silicon film 110 may contain a metal element contained in the conductive layer 104 or silicide formed with the metal element.

As in the first silicon film 109, also in the second silicon film 110, the following surface is defined as the interface between the region 110a and the core 110b: a surface which is parallel to the surface of the conductive layer 104 and overlaps with the bottom of the deepest valley of valleys each formed between the cores 110b. Further, the following surface is defined as the interface between the region 110c and the outer shell 110d: a surface which is parallel to the surface of the conductive layer 104 and overlaps with the bottom of the deepest valley of valleys each formed between the outer shells 110d.

In the second silicon film 110, the region 109a grows to form the region 110a. The seed crystal 109b grows to have whisker-like portions, so that the core 110b is formed. The crystallinity of the region 110a and the core 110b is decreased as they grow, whereby the region 110c and the outer shell 110d are formed. These can be caused for the following reason. By an LPCVD method, amorphous silicon is crystallized while being deposited, so that crystalline silicon is formed. Since the deposition rate is high in the third step 203, deposition process predominates over crystallization; accordingly, amorphous silicon is formed around crystalline silicon such as the region 110a and the core 110b.

The seed crystal 109b is likely to grow to have whisker-like portions in the third step 203, and silicon is grown from part of a surface of the region 110a between the cores 110b to have whisker-like portions (including a core and an outer shell) in some cases (not illustrated).

Whisker-like portions of the second silicon film 110 may each have a columnar (cylindrical or prismatic) shape or a conical or pyramidal shape (which may also be referred to as needle-like shape). A top portion of the second silicon film 110 may be curved.

Here, the direction in which the core 110b is extended from the region 110a is called the longitudinal direction, and the shape of a cross section along the longitudinal direction is called a longitudinal cross-sectional shape. In addition, a cross-sectional shape of the whisker-like portion of the second silicon film 110 which is cut along a surface perpendicular to or substantially perpendicular to the longitudinal direction of the whisker-like portion of the second silicon film 110 is called a transverse cross-sectional shape.

The longitudinal directions of the whisker-like portions of the second silicon film 110 do not necessarily have to be the same (see FIG. 1C). In a transverse cross section of the whisker-like portion of the second silicon film 110, the core 110b is observed (is not observed) in some cases depending on the position. Further, the transverse cross section of the whisker-like portion of the second silicon film 110 is circular when the whisker-like portion of the second silicon film 110 has a cylindrical or conical shape, and is polygonal when the whisker-like portion of the second silicon film 110 has a prismatic or pyramidal shape. When the longitudinal directions of the whisker-like portions of the second silicon film 110 are not the same, one of the whisker-like portions of the second silicon film 110 is likely to be entangled with any of the other whisker-like portions. Thus, the use of the second silicon film 110 as an active material layer of a power storage device does not permit the active material layer to be separated easily at the time of charge/discharge, which is preferable.

The width of the core 110b in transverse cross section is greater than or equal to 0.2 µm and less than or equal to 3 µm preferably greater than or equal to 0.5 µm and less than or equal to 2 µm.

The length of the core 110b (in the longitudinal direction) is not particularly limited but may be greater than or equal to 0.5 μm and less than or equal to 1000 μm, preferably greater than or equal to 2.5 μm and less than or equal to 100 μm.

The width of a cross section of each of the whisker-like portions of the second silicon film 110 is greater than or equal to 0.2 μm and less than or equal to 10 μm, preferably greater than or equal to 1 μm and less than or equal to 5 μm. The length (in the longitudinal direction) of each of the whisker-like portions of the second silicon film 110 is greater than or equal to 3 μm and less than or equal to 1000 μm, preferably greater than or equal to 6 μm and less than or equal to 200 μm.

Note that the "length" of the core 110b refers to the distance between the top (or the center of the top surface) of the core 110b and the region 110a along the axis of the core 110b. In addition, the "length" of the second silicon film 110 refers to the distance between the top (or the center of the top surface) of the outer shell 110d and the region 110a along with the extended line of the axis of the core 110b.

The second silicon film 110 grows to have whisker-like portions and thus has a large surface area as compared to the case where the second silicon film 110 grows to have a planar shape. Therefore, in the case where a power storage device is manufactured with the use of the second silicon film 110 as an active material layer thereof, the rate of storing ions serving as carriers and the rate of releasing ions serving as carriers are high, so that the power storage device can be charged and discharged at high speed.

The region 110c and the outer shell 110d are partly or wholly formed of amorphous silicon. An active material layer of a power storage device, using the second silicon film 110 as the active material layer, is resistant to change in volume due to storage and release of ions serving as carriers (e.g., stress caused by expansion in volume is relieved) as compared to an active material body whose whisker-like portions are wholly crystallized. For this reason, the second silicon film 110 does not easily turn into fine powder, resulting in suppression of separation or the like. Therefore, the power storage device can have excellent cycle characteristics. Further, as described above, when the flow rate of the deposition gas containing silicon in the third step 203 is higher than that in the first step 201, the deposition rate is higher in the third step 203 than in the first step 201. Thus, in the second silicon film 110, the proportion of the region 110c and the outer shell 110d can be relatively increased (with respect to the proportion of the region 110a and the core 110b), so that the power storage device can be more resistant to change in volume.

The second silicon film 110 is formed of not only amorphous silicon but also crystalline silicon of the region 110a and the cores 110b. Thus, in the case where the second silicon film 110 is used as an active material layer of a power storage device, the conductivity is increased as compared to the case where an active material layer is formed of only amorphous silicon, so that the power storage device can have higher charge/discharge capacity. Further, the use of the second silicon film 110 as an active material layer of a power storage device leads to an increase in rate of storing and releasing ions serving as carriers per unit mass, so that the power storage device can be charged and discharged at high speed. Further, as described above, when the flow rate of the deposition gas containing silicon in the third step 203 is lower than that in the first step 201, the deposition rate is lower in the third step 203 than in the first step 201. Accordingly, in the second silicon film 110, the proportion of the region 110a and the core 110b can be relatively increased (with respect to the proportion of the region 110c and the outer shell 110d), which can further increase the rate of storing ions, the rate of releasing ions, and the conductivity.

In the case where the second silicon film 110 is used as an active material layer of a power storage device, one of or both the conductive layer 104 and the mixed layer 105 may function as a current collector of the power storage device. In the case where the mixed layer 105 is formed, the interfacial resistance between the mixed layer 105 and the region 110a is lower, and thus, the conductivity of the interface between the mixed layer 105 and the region 110a is higher. Therefore, an increase in charge/discharge capacity of the power storage device can be achieved.

Further, in the second silicon film 110, formation of a low density region between the conductive layer 104 and the region 110a is suppressed, which enables favorable adhesion between the conductive layer 104 and the second silicon film 110. Thus, in the case where the second silicon film 110 is used as an active material layer of a power storage device, even when charge and discharge cycles are repeated, the active material layer is less likely to turn into fine powder, which suppresses separation. Consequently, the power storage device can have improved cycle characteristics. The improved adhesion reduces the interfacial resistance between the conductive layer 104 and the mixed layer 105, resulting in higher conductivity of the interface between the conductive layer 104 and the mixed layer 105. Thus, an increase in charge/discharge capacity of the power storage device can be achieved.

After the third step 203, the supply of the source gas is stopped, the second silicon film 110 may be subjected to heat treatment while the source gas is exhausted from the reaction space of the LPCVD apparatus. The heat treatment can crystallize part or the whole of the region 110c and the outer shell 110d, which are formed of amorphous silicon, in the second silicon film 110. Thus, conductivity is increased, so that an increase in charge/discharge capacity of the power storage device can be achieved. Further, the rate of storing ions serving as carriers and the rate of releasing ions serving as carriers are increased per unit mass, which allows high-speed charging and discharging of the power storage device.

Although the example is described in which the silicon film formed by the formation method according to one embodiment of the present invention is used as an active material layer of a power storage device, the silicon film may be used for another application. For example, the silicon film may be used for a photoelectric conversion layer of a photoelectric conversion device. Alternatively, the silicon film may be used for an antireflective film.

Note that this embodiment can be implemented in appropriate combination with any of the structures of the other embodiments and example.

(Embodiment 2)

In this embodiment, a power storage device according to one embodiment of the present invention will be described.

The power storage device according to one embodiment of the present invention includes at least a positive electrode, a negative electrode, a separator, and an electrolyte. The negative electrode includes the silicon film according to Embodiment 1 as an active material layer.

The electrolyte is a nonaqueous solution containing an electrolyte salt or a solution containing an electrolyte salt. Any electrolyte salt can be used as the electrolyte salt as long as it contains carrier ions such as alkali metal ions, alkaline earth metal ions, beryllium ions, or magnesium ions. Examples of the alkali metal ions include lithium ions, sodium ions, and potassium ions. Examples of the alkaline earth metal ions include calcium ions, strontium ions, and barium ions. In this embodiment, an electrolyte salt containing lithium ions (hereinafter referred to as a lithium-containing electrolyte salt) is used as the electrolyte salt.

With the above structure, a lithium-ion secondary battery or a lithium-ion capacitor can be formed.

Here, a lithium-ion secondary battery will be described with reference to drawings.

Figure 3A:
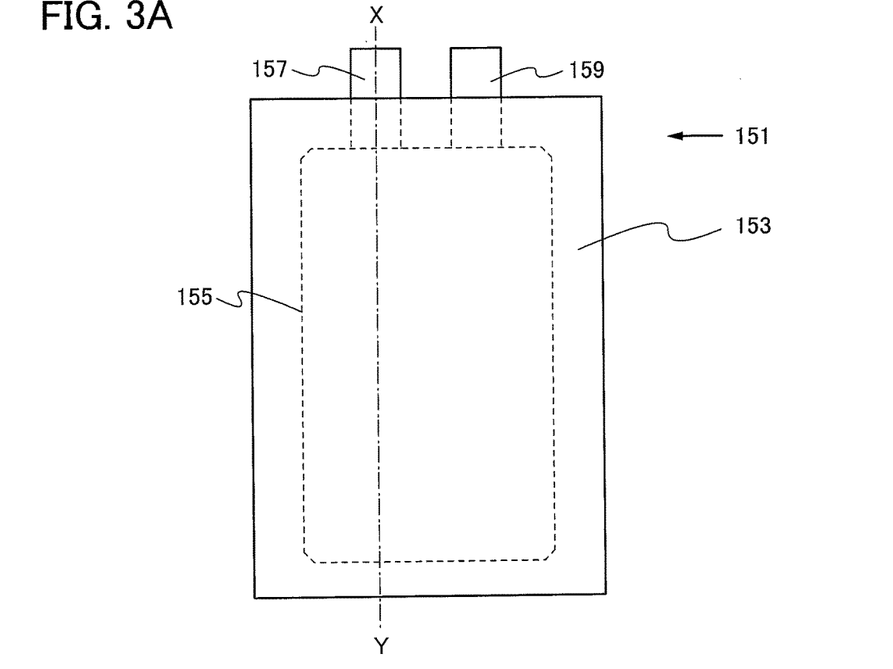
FIGS. 3A and 3B are a plan-view and a cross-sectional view which illustrate a power storage device according to one embodiment.
Figure 3B:
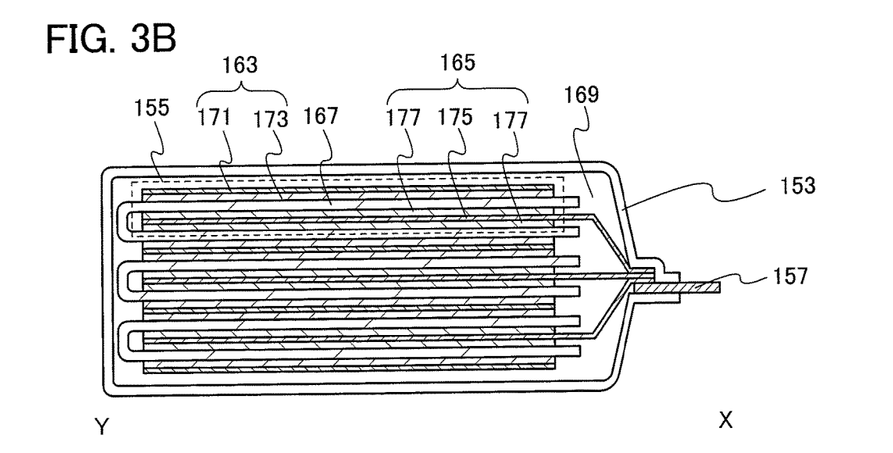

FIG. 3A illustrates a structural example of a power storage device 151. FIG. 3B is a cross-sectional view along dashed dotted line X-Y in FIG. 3A.

The power storage device 151 in FIG. 3A includes a power storage cell 155 in an exterior member 153. The power storage device 151 further includes terminal portions 157 and 159 which are connected to the power storage cell 155. For the exterior member 153, a laminate film, a polymer film, a metal film, a metal case, a plastic case, or the like can be used.

As illustrated in FIG. 3B, the power storage cell 155 includes a negative electrode 163, a positive electrode 165, a separator 167 between the negative electrode 163 and the positive electrode 165, and an electrolyte 169 with which a portion almost surrounded with the exterior member 153 is filled.

The negative electrode 163 includes a negative electrode current collector 171 and a negative electrode active material layer 173. The negative electrode active material layer 173 is formed on one surface or opposite surfaces of the negative electrode current collector 171. The negative electrode current collector 171 is connected to the terminal portion 159. A positive electrode current collector 175 is connected to the terminal portion 157. Further, the terminal portions 157 and 159 each partly extend outside the exterior member 153.

The positive electrode 165 includes the positive electrode current collector 175 and a positive electrode active material layer 177. The positive electrode active material layer 177 is formed on one surface or opposite surfaces of the positive electrode current collector 175. Further, the positive electrode 165 may include a binder and a conductive additive besides the positive electrode current collector 175 and the positive electrode active material layer 177.

Although a sealed thin power storage device is described as the power storage device 151 in this embodiment, the external shape of the power storage device 151 is not limited thereto. A power storage device having any of a variety of shapes, such as a button power storage device, a cylindrical power storage device, or a rectangular power storage device, can be used as the power storage device 151. Further, although the structure where the positive electrode, the negative electrode, and the separator are stacked is described in this embodiment, a structure where the positive electrode, the negative electrode, and the separator are rolled may be employed.

For the positive electrode current collector 175, a conductive material such as aluminum or stainless steel which is processed into a foil shape, a plate shape, a net shape, or the like can be used. Alternatively, a conductive layer provided by deposition separately on a substrate and then separated from the substrate can be used as the positive electrode current collector 175.

The positive electrode active material layer 177 can be formed using any of $LiFeO_2$, $LiCoO_2$, $LiNiO_2$, $LiMn_2O_4$, $LiFePO_4$, $LiCoPO_4$, $LiNiPO_4$, $LiMnPO_4$, $V_2O_5$, $Cr_2O_5$, $MnO_2$, and other lithium compounds as a material. Note that when carrier ions are alkali metal ions other than lithium ions, alkaline earth metal ions, beryllium ions, or magnesium ions, the positive electrode active material layer 177 can be formed using, instead of lithium in the above lithium compounds, an alkali metal (e.g., sodium or potassium), an alkaline earth metal (e.g., calcium, strontium, or barium), beryllium, or magnesium.

The positive electrode active material layer 177 is formed over the positive electrode current collector 175 by a coating method or a physical vapor deposition method (e.g., a sputtering method), whereby the positive electrode 165 can be formed. In the case where a coating method is employed, the positive electrode active material layer 177 is formed in such a manner that a paste in which a conductive additive (for example, acetylene black (AB), a binder (e.g., polyvinylidene fluoride (PVDF))), or the like is mixed with any of the above materials for the positive electrode active material layer 177 is applied to the positive electrode current collector 175 and dried. In this case, the positive electrode active material layer 177 is preferably molded by applying pressure as needed.

Note that as the conductive additive, any electron-conductive material can be used as long as it does not cause a chemical change in the power storage device. For example, a carbon-based material such as graphite or carbon fibers; a metal material such as copper, nickel, aluminum, or silver; or a powder or fiber of a mixture thereof can be used.

As the binder, polysaccharides such as starch, carboxymethyl cellulose, hydroxypropyl cellulose, regenerated cellulose, and diacetyl cellulose; vinyl polymers such as polyvinyl chloride, polyethylene, polypropylene, polyvinyl alcohol, polyvinyl pyrrolidone, polytetrafluoroethylene, polyvinylide fluoride, ethylene-propylene-diene monomer (EPDM) rubber, sulfonated EPDM rubber, styrene-butadiene rubber, butadiene rubber, and fluorine rubber; polyether such as polyethylene oxide; and the like can be given.

Alternatively, for the positive electrode active material layer 177, a paste in which, instead of a conductive additive and a binder, graphene or multilayer graphene may be mixed with any of the above materials for the positive electrode active material layer 177 may be used. Note that in this specification, graphene refers to one atomic layer of a sheet of carbon molecules having $sp^2$ bonds. Further, multilayer graphene refers to a stack of 2 to 100 sheets of graphene, and the proportion of elements other than hydrogen and carbon is preferably 15 at. % or lower, or the proportion of elements other than carbon is preferably 30 at. % or lower. Note that an alkali metal such as potassium may be added to the graphene or the multilayer graphene.

The use of graphene or multilayer graphene instead of a conductive additive and a binder leads to a reduction in amount of the conductive additive and the binder in the positive electrode 165. In other words, the weight of the positive electrode 165 can be reduced; accordingly, the charge/discharge capacity of the lithium-ion secondary battery per unit weight of the electrode can be increased.

Strictly speaking, the term "active material" refers only to a material that relates to intercalation and deintercalation of ions functioning as carriers. In this specification, however, in the case of employing a coating method to form the positive electrode active material layer 177, for the sake of convenience, the material of the positive electrode active material layer 177, that is, a substance that is actually a "positive electrode active material," a conductive additive, a binder, and the like are collectively referred to as the positive electrode active material layer 177.

In the negative electrode 163, the negative electrode current collector 171 is one of or both the conductive layer 104 and the mixed layer 105, which are described in Embodiment 1, and the negative electrode active material layer 173 can be formed using a silicon film formed by the method described in Embodiment 1. In addition, when the active material layer is formed using the silicon film, with the negative electrode current collector 171 held by a frame-like susceptor in an LPCVD apparatus, the active material layer can be formed on both the surfaces of the negative electrode current collector 171 at the same time. Accordingly, the number of manufacturing steps can be reduced in the case where both the surfaces of the negative electrode current collector 171 are used for formation of the electrode.

The negative electrode active material layer 173 may be predoped with lithium. Predoping with lithium may be performed in such a manner that a lithium layer is formed on a surface of the negative electrode active material layer 173 by a sputtering method. Alternatively, lithium foil is provided on the surface of the negative electrode active material layer 173, whereby the negative electrode active material layer 173 can be predoped with lithium.

Alternatively, graphene or multilayer graphene may be formed on the surface of the negative electrode active material layer 173. The formation of graphene or multilayer graphene thereon can reduce effects due to expansion and contraction of the negative electrode active material layer 173 which are caused by dissolution and precipitation of lithium or doping or dedoping of lithium ions (the formation of graphene or multilayer graphene thereon can prevent the negative electrode active material layer 173 from turning into fine powder and being separated). Graphene or multilayer graphene can be formed on the surface of the negative electrode active material layer 173 in such a manner that the negative electrode current collector 171 over which the negative electrode active material layer 173 is formed is soaked in a solution containing graphene oxide and the solution is subjected to electrophoresis. Alternatively, to form graphene or multilayer graphene on the surface of the negative electrode active material layer 173, a dip coating method using the solution may be employed.

The electrolyte 169 is a nonaqueous solution containing an electrolyte salt or a solution containing an electrolyte salt. Particularly in a lithium-ion secondary battery, a nonaqueous solution which contains a lithium-containing electrolyte salt and in which lithium ions (carrier ions) can transfer and stably exist or a solution which contains the lithium-containing electrolyte salt is used. Typical examples of the electrolyte salt include lithium salts such as $LiClO_4$, $LiAsF_6$, $LiBF_4$, $LiPF_6$, and $Li(C_2F_5SO_2)_2N$. Note that when carrier ions are alkali metal ions other than lithium ions or alkaline earth metal ions, alkali metal salt (e.g., sodium salt or potassium salt), alkaline earth metal salt (e.g., calcium salt, strontium salt or barium salt), beryllium salt, magnesium salt, or the like can be used as a solute of the electrolyte 169.

The electrolyte 169 is preferably a nonaqueous solution containing an electrolyte salt. That is, as a solvent of the electrolyte 169, an aprotic organic solvent is preferably used. Examples of the aprotic organic solvent include ethylene carbonate, propylene carbonate, dimethyl carbonate, diethyl carbonate, γ-butyrolactone, acetonitrile, dimethoxyethane, and tetrahydrofuran, and one or more of these materials can be used. Alternatively, as the aprotic organic solvent, one ionic liquid or a plurality of ionic liquids may be used. Owing to non-flammability and non-volatility of an ionic liquid, it is possible to suppress explosion, inflammation, and the like of the power storage device 151 at the time when the internal temperature of the power storage device 151 rises, resulting in improvement in safety.

When a gelled high-molecular material containing an electrolyte salt is used as the electrolyte 169, safety against liquid leakage and the like is improved and the power storage device 151 can be thinner and more lightweight. Examples of the gelled high-molecular material include a silicon gel, an acrylic gel, an acrylonitrile gel, polyethylene oxide, polypropylene oxide, and a fluorine-based polymer.

As the electrolyte 169, a solid electrolyte such as $Li_3PO_4$ can be used.

As the separator 167, an insulating porous material is used. For example, paper; nonwoven fabric; a glass fiber; ceramics; a synthetic fiber containing nylon (polyamide), vinylon (polyvinyl alcohol based fiber), polyester, acrylic, polyolefin, or polyurethane; or the like may be used. Note that a material which does not dissolve in the electrolyte 169 needs to be selected.

A lithium-ion secondary battery has a small memory effect, a high energy density, and a high charge/discharge capacity. In addition, the output voltage of the lithium ion battery is high. Thus, it is possible to reduce the size and weight of the lithium-ion battery. Further, the lithium ion battery does not easily deteriorate due to repeated charge/discharge cycles and can be used for a long time, leading to a reduction in cost.

In the case where the power storage device according to one embodiment of the present invention is a lithium-ion capacitor, instead of the positive electrode active material layer 177, a material capable of reversibly occluding and releasing one of or both lithium ions and anions may be used. Examples of the material include active carbon, carbon nanotube, fullerene, graphite, a conductive high molecule, and a polyacene organic semiconductor (PAS).

The method for forming a silicon film, according to one embodiment of the present invention, permits formation of a power storage device having a high charge/discharge capacity.

High adhesion between a current collector and an active material layer in a power storage device manufactured using the method for forming a silicon film, according to one embodiment of the present invention, allows an electrode to be bended. Thus, the power storage device can be flexible.

Note that the power storage device according to one embodiment of the present invention can be an air cell. The use of an electrode manufactured using the method for forming a silicon film, according to one embodiment of the present invention, permits manufacture of an air cell with high charge/discharge capacity.

Note that this embodiment can be implemented in appropriate combination with any of the structures of the other embodiments and example.

(Embodiment 3)

The power storage device according to one embodiment of the present invention can be used for power supplies of a variety of electric appliances which can be operated with power.

Specific examples of electric appliances each utilizing the power storage device according to one embodiment of the present invention are as follows: display devices, lighting devices, desktop personal computers and laptop personal computers, image reproduction devices which reproduce still images and moving images stored in recording media such as digital versatile discs (DVDs), mobile phones, portable game machines, portable information terminals, e-book readers, video cameras, digital still cameras, high-frequency heating appliances such as microwave ovens, electric rice cookers, electric washing machines, air-conditioning systems such as air conditioners, electric refrigerators, electric freezers, electric refrigerator-freezers, freezers for preserving DNA, and medical electrical equipment such as dialyzers. In addition, moving objects driven by electric motors using power from power storage devices are also included in the category of electric appliances. Examples of the moving objects include electric vehicles, hybrid vehicles each including both an internal-combustion engine and an electric motor, and motorized bicycles including motor-assisted bicycles.

In the electric appliances, the power storage device according to one embodiment of the present invention can be used as a power storage device for supplying enough power for almost the whole power consumption (referred to as a main power supply). Alternatively, in the electric appliances, the power storage device according to one embodiment of the present invention can be used as a power storage device which can supply power to the electric appliances when the supply of power from the main power supply or a commercial power supply is stopped (such a power storage device is referred to as an uninterruptible power supply). Still alternatively, in the electric appliances, the power storage device according to one embodiment of the present invention can be used as a power storage device for supplying power to the electric appliances at the same time as the power supply from the main power supply or a commercial power supply (such a power storage device is referred to as an auxiliary power supply).

Figure 4:
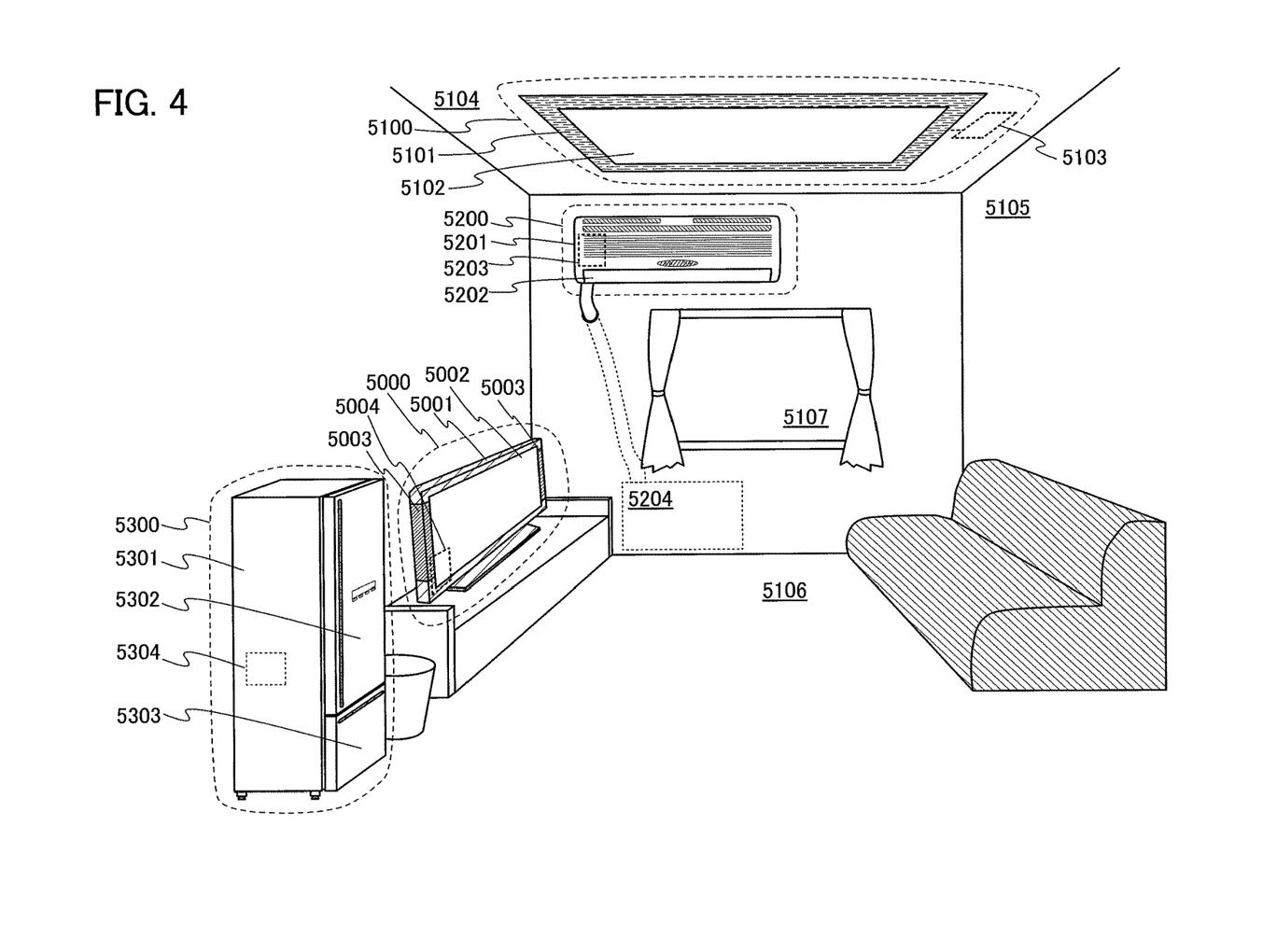
FIG. 4 illustrates application examples of power storage devices.

FIG. 4 illustrates specific structures of the electric appliances. In FIG. 4, a display device 5000 is an example of an electric appliance including a power storage device 5004 according to one embodiment of the present invention. Specifically, the display device 5000 corresponds to a display device for TV broadcast reception and includes a housing 5001, a display portion 5002, speaker portions 5003, and the power storage device 5004. The power storage device 5004 according to one embodiment of the present invention is provided in the housing 5001. The display device 5000 can receive power from a commercial power supply. Alternatively, the display device 5000 can use power stored in the power storage device 5004. Thus, the display device 5000 can be operated with the use of the power storage device 5004 according to one embodiment of the present invention as an uninterruptible power supply even when power cannot be supplied from a commercial power supply due to power failure or the like.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), or a field emission display (FED) can be used for the display portion 5002.

Note that the display device includes, in its category, all of information display devices for personal computers, advertisement displays, and the like besides TV broadcast reception.

In FIG. 4, an installation lighting device 5100 is an example of an electric appliance including a power storage device 5103 according to one embodiment of the present invention. Specifically, the lighting device 5100 includes a housing 5101, a light source 5102, and a power storage device 5103. Although FIG. 4 illustrates the case where the power storage device 5103 is provided in a ceiling 5104 on which the housing 5101 and the light source 5102 are installed, the power storage device 5103 may be provided in the housing 5101. The lighting device 5100 can receive power from a commercial power supply. Alternatively, the lighting device 5100 can use power stored in the power storage device 5103. Thus, the lighting device 5100 can be operated with the use of the power storage device 5103 according to one embodiment of the present invention as an uninterruptible power supply even when power cannot be supplied from a commercial power supply due to power failure or the like.

Note that although the installation lighting device 5100 provided in the ceiling 5104 is illustrated in FIG. 4 as an example, the power storage device according to one embodiment of the present invention can be used in an installation lighting device provided in, for example, a wall 5105, a floor 5106, a window 5107, or the like other than the ceiling 5104. Alternatively, the power storage device can be used in a tabletop lighting device or the like.

As the light source 5102, an artificial light source which emits light artificially by using power can be used. Specifically, discharge lamps such as an incandescent lamp and a fluorescent lamp, and light-emitting elements such as an LED and an organic EL element are given as examples of the artificial light source.

In FIG. 4, an air conditioner including an indoor unit 5200 and an outdoor unit 5204 is an example of an electric appliance including a power storage device 5203 according to one embodiment of the invention. Specifically, the indoor unit 5200 includes a housing 5201, an air outlet 5202, and a power storage device 5203. Although FIG. 4 illustrates the case where the power storage device 5203 is provided in the indoor unit 5200, the power storage device 5203 may be provided in the outdoor unit 5204. Alternatively, the power storage devices 5203 may be provided in both the indoor unit 5200 and the outdoor unit 5204. The air conditioner can receive power from a commercial power supply. Alternatively, the air conditioner can use power stored in the power storage device 5203. Particularly in the case where the power storage devices 5203 are provided in both the indoor unit 5200 and the outdoor unit 5204, the air conditioner can be operated with the use of the power storage device 5203 according to one embodiment of the present invention as an uninterruptible power supply even when power cannot be supplied from a commercial power supply due to power failure or the like.

Note that although the split-type air conditioner including the indoor unit and the outdoor unit is illustrated in FIG. 4 as an example, the power storage device according to one embodiment of the present invention can be used in an air conditioner in which the functions of an indoor unit and an outdoor unit are integrated in one housing.

In FIG. 4, an electric refrigerator-freezer 5300 is an example of an electric appliance including a power storage device 5304 according to one embodiment of the present invention. Specifically, the electric refrigerator-freezer 5300 includes a housing 5301, a door for a refrigerator 5302, a door for a freezer 5303, and the power storage device 5304. The power storage device 5304 is provided in the housing 5301 in FIG. 4. The electric refrigerator-freezer 5300 can receive power from a commercial power supply. Alternatively, the electric refrigerator-freezer 5300 can use power stored in the power storage device 5304. Thus, the electric refrigerator-freezer 5300 can be operated with the use of the power storage device 5304 according to one embodiment of the present invention as an uninterruptible power supply even when power cannot be supplied from a commercial power supply due to power failure or the like.

Note that among the electric appliances described above, a high-frequency heating apparatus such as a microwave oven and an electric appliance such as an electric rice cooker require high power in a short time. The tripping of a breaker of a commercial power supply in use of an electric appliance can be prevented by using the power storage device according to one embodiment of the present invention as an auxiliary power supply for supplying power which cannot be supplied enough by a commercial power supply.

In addition, in a time period when electric appliances are not used, particularly when the proportion of the amount of power which is actually used to the total amount of power which can be supplied from a commercial power supply source (such a proportion referred to as a usage rate of power) is low, power can be stored in the power storage device, whereby the usage rate of power can be reduced in a time period when the electric appliances are used. For example, in the case of the electric refrigerator-freezer 5300, power can be stored in the power storage device 5304 in night time when the temperature is low and the door for a refrigerator 5302 and the door for a freezer 5303 are not often opened or closed. On the other hand, in daytime when the temperature is high and the door for a refrigerator 5302 and the door for a freezer 5303 are frequently opened and closed, the power storage device 5304 is used as an auxiliary power supply; thus, the usage rate of power in daytime can be reduced.

This embodiment can be implemented in appropriate combination with any of the other embodiments and example.

EXAMPLE 1

In this example, evaluation results of a silicon film formed according to one embodiment of the present invention will be described. Note that descriptions in this example will be given using FIGS. 1A to 1C, FIGS. 2A and 2B, and reference numerals in FIGS. 1A to 1C and FIGS. 2A and 2B.

In this example, titanium foil with a diameter of 12 mm (the purity: 99.5%, the thickness: 0.1 mm) was used as the conductive layer 104; thus, the substrate 101 was not used. The titanium foil was immersed in a hydrofluoric acid solution for 10 minutes, whereby the surface thereof was cleaned.

In the first step 201, the titanium foil was placed in a reaction chamber (reaction space) of an LPCVD apparatus, a silane ($SiH_4$) gas was supplied into the reaction chamber at a flow rate of 1000 sccm, the pressure in the reaction chamber was controlled to be 100 Pa, and heating was performed at 600° C. in the reaction chamber for 10 minutes, so that the first silicon film 109 was formed on the titanium foil. In increasing the temperature in the first step 201, a small amount of helium gas was supplied into the reaction chamber. The reaction chamber was made of quartz.

The second step 202 was as follows. The supply of a silane ($SiH_4$) gas was stopped. Then, the reaction chamber was evacuated and heat treatment was performed on the first silicon film 109 on the titanium foil. The time spent for the second step 202 including the period in which the supply of a silane gas was stopped, the period in which the reaction chamber was evacuated, and the period in which heat treatment was performed was five minutes. The temperature in the reaction chamber was 600° C. as in the first step 201.

In the third step 203, the titanium foil was placed in the reaction chamber of the LPCVD apparatus, a silane ($SiH_4$) gas was supplied into the reaction chamber at a flow rate of 700 sccm, the pressure in the reaction chamber was controlled to be 100 Pa, and heating was performed at 600° C. in the reaction chamber for 60 minutes, so that the second silicon film 110 was formed.

The silicon film formed through the above steps is a sample A.

Here, a sample B was formed as a comparative example. The sample B was formed by performing only a step corresponding to the first step 201.

The sample B was formed in the following manner. A titanium foil with a diameter of 12 mm (the purity: 99.5%, the thickness: 0.1 mm) was placed in a reaction chamber (reaction space) of an LPCVD apparatus. A silane ($SiH_4$) gas was supplied into the reaction chamber at a flow rate of 1000 sccm. The pressure in the reaction chamber was controlled to be 100 Pa. Then, heating was performed at 600° C. in the reaction chamber for 60 minutes, so that a silicon film as the sample B was formed on the titanium foil.

Figure 5A:
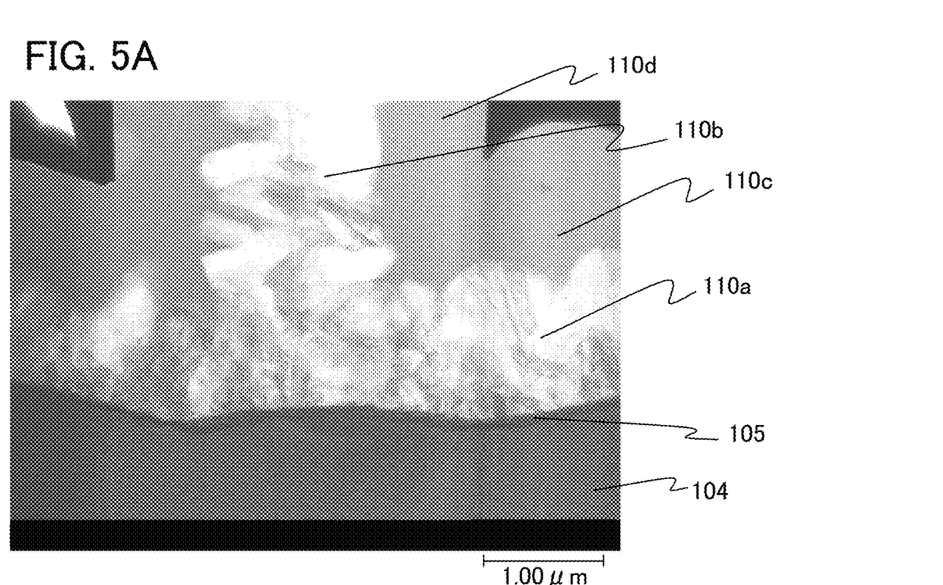
FIGS. 5A and 5B are STEM images each of which shows a cross section of silicon films.
Figure 5B:
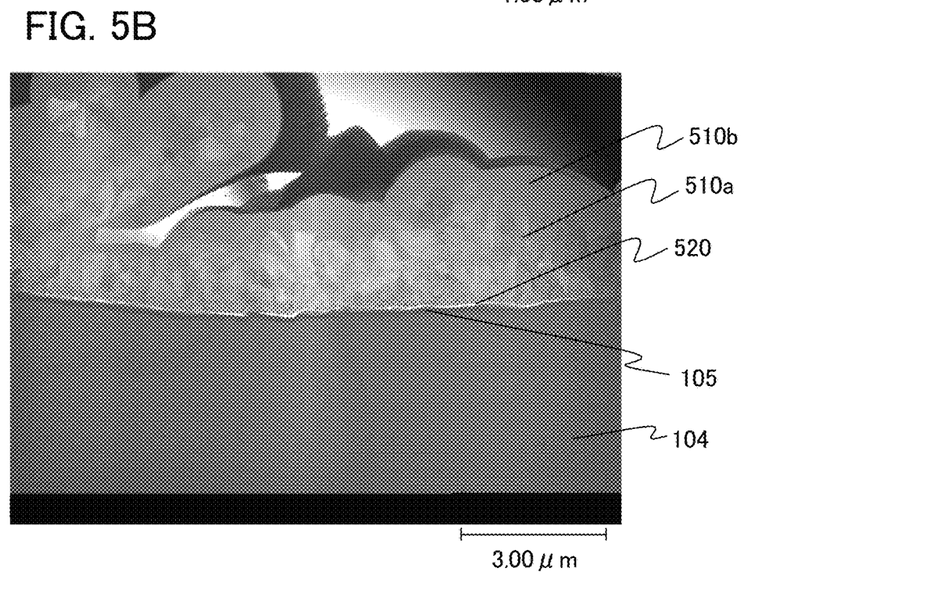

FIG. 5A is a cross-sectional STEM (scanning transmission electron microscope) image showing a given part of a surface of the sample A, and FIG. 5B is a cross-sectional STEM image showing a given part of a surface of the sample B. The magnifications of the images in FIGS. 5A and 5B are 25000 times and 10000 times, respectively.

As the sample A, the second silicon film 110 having whisker-like portions includes the region 110a and the core 110b which are formed of crystalline silicon and the region 110c and the outer shell 110d which are formed of amorphous silicon (see FIG. 5A). Note that the difference in visibility between the STEM images allows discrimination between the amorphous silicon and the crystalline silicon.

The silicon film obtained as the sample B includes a region 510a formed of crystalline silicon and a region 510b formed of amorphous silicon.

FIG. 5B shows that the sample B includes a low density region 520 (a white region indicated by a leader in FIG. 5B) between the crystalline silicon having whisker-like portions and titanium silicide (corresponding to the mixed layer 105 in FIGS. 1B and 1C) on the titanium foil.

In contrast, in the case of the sample A, such a low density region (white region) in FIG. 5B is not observed between the second silicon film 110 and titanium silicide on the titanium foil in FIG. 5A. This result suggests that the adhesion of the sample A to the titanium foil is higher than the adhesion of the sample B to the titanium foil and that a silicon film having good adhesion to a conductive layer can be formed by the method for forming a silicon film, according to one embodiment of the present invention.

Thus, when an active material layer of a power storage device is formed using the method for forming a silicon film, according to one embodiment of the present invention, the active material layer can be prevented from turning into fine powder to be separated due to repeated charge and discharge cycles, resulting in an improvement in cycle characteristics of the power storage device and an increase in charge/discharge capacity of the power storage device.

This application is based on Japanese Patent Application serial no. 2011-151597 filed with the Japan Patent Office on Jul. 8, 2011, the entire contents of which are hereby incorporated by reference.

What is claimed is:
1. A method for forming a silicon film, comprising:
    forming a first silicon film over a conductive layer by a low-pressure chemical vapor deposition method by supplying a source gas which contains a deposition gas containing silicon into a reaction space at a temperature range which is suitable for forming the first silicon film by the low-pressure chemical vapor deposition method;
    stopping the supply of the source gas and exhausting the source gas from the reaction space, wherein the reaction space is kept at the temperature range; and forming a second silicon film over the first silicon film so that the second silicon film has whisker-like portions by a low-pressure chemical vapor deposition method by supplying the source gas whose flow rate is higher than that of the source gas used in forming the first silicon film into the reaction space at the temperature range, wherein the conductive layer is not placed out of the reaction space in any period of the above processes.

2. The method for forming a silicon film, according to claim 1, wherein a mixed layer containing silicon and a metal element of the conductive layer is formed between the first silicon film and the conductive layer.

3. The method for forming a silicon film, according to claim 1, wherein the first silicon film is crystalline and the second silicon film is amorphous.

4. The method for forming a silicon film, according to claim 1, wherein the temperature range is higher than 530° C. and lower than 650° C.

5. The method for forming a silicon film, according to claim 1, wherein silicon hydride, silicon fluoride, or silicon chloride is used for the deposition gas containing silicon.

6. The method for forming a silicon film, according to claim 1, wherein the conductive layer contains a metal element which forms silicide by reacting with silicon.

7. The method for forming a silicon film, according to claim 6, wherein the metal element is zirconium, titanium, hafnium, vanadium, niobium, tantalum, chromium, molybdenum, tungsten, cobalt, or nickel.

8. A method for manufacturing a power storage device including at least a positive electrode, a negative electrode, and an electrolyte, comprising:
    forming an active material layer included in the negative electrode, comprising;
        a first step of supplying a source gas at a first flow rate into a reaction space at a temperature range to form a silicon film including a seed crystal over a conductive layer by a low-pressure chemical vapor deposition method, wherein the source gas contains a deposition gas containing silicon;
        a second step comprising stopping the supply of the source gas and exhausting the source gas from the reaction space, wherein the reaction space is kept at the temperature range; and
        a third step of resuming the supply of the source gas at a second flow rate into the reaction space at the temperature range to grow the silicon film by the low-pressure chemical vapor deposition method so that the second silicon film has whisker-like portions,
    wherein the first flow rate is lower than the second flow rate,
    wherein the temperature range is suitable for forming the silicon film by the low-pressure chemical vapor deposition method, and
    wherein the conductive layer is not placed out of the reaction space in any period from the first step to the third step.

9. The method for manufacturing a power storage device, according to claim 8, wherein a mixed layer containing silicon and a metal element of the conductive layer is formed between the conductive layer and the silicon film.

10. The method for manufacturing a power storage device, according to claim 8, wherein the silicon film comprises an amorphous portion.

11. The method for manufacturing a power storage device, according to claim 8, wherein the temperature range is higher than 530° C. and lower than 650° C.

12. The method for manufacturing a power storage device, according to claim 8, wherein silicon hydride, silicon fluoride, or silicon chloride is used for the deposition gas containing silicon.

13. The method for manufacturing a power storage device, according to claim 8, wherein the conductive layer contains a metal element which forms silicide by reacting with silicon.

14. The method for manufacturing a power storage device, according to claim 13, wherein the metal element is zirconium, titanium, hafnium, vanadium, niobium, tantalum, chromium, molybdenum, tungsten, cobalt, or nickel.

15. A method for forming a silicon film, comprising:
    a first step of forming a silicon film over a conductive layer by a low-pressure chemical vapor deposition method by supplying a source gas which contains a deposition gas containing silicon into a reaction space at a temperature range which is suitable for forming the silicon film by the low-pressure chemical vapor deposition method;
    a second step of stopping the supply of the source gas and exhausting the source gas from the reaction space, wherein the reaction space is kept at the temperature range; and
    a third step of resuming the supply of the source gas whose flow rate is higher than that of the source gas used in the first step into the reaction space at the temperature range to grow the silicon film having whisker-like portions by the low-pressure chemical vapor deposition method, wherein the conductive layer is not placed out of the reaction space in any period from the first step to the third step.

16. The method for forming a silicon film, according to claim 15, wherein a mixed layer containing silicon and a metal element of the conductive layer is formed between the conductive layer and the silicon film.

17. The method for forming a silicon film, according to claim 15, wherein the silicon film comprises an amorphous portion.

18. The method for forming a silicon film, according to claim 15, wherein the temperature range is higher than 530° C. and lower than 650° C.

19. The method for forming a silicon film, according to claim 15, wherein silicon hydride, silicon fluoride, or silicon chloride is used for the deposition gas containing silicon.

20. The method for forming a silicon film, according to claim 15, wherein the conductive layer contains a metal element which forms silicide by reacting with silicon.

* * * * *